United States Patent [19]

McFeaters

[11] Patent Number: 4,851,262
[45] Date of Patent: Jul. 25, 1989

[54] METHOD OF MAKING CARBIDE, NITRIDE AND BORIDE POWDERS

[75] Inventor: John S. McFeaters, Pittsburgh, Pa.

[73] Assignee: Carnegie-Mellon University, Pittsburgh, Pa.

[21] Appl. No.: 54,874

[22] Filed: May 27, 1987

[51] Int. Cl.⁴ .................. C23C 16/04; C04B 35/56; C04B 35/58

[52] U.S. Cl. .................. 427/217; 427/251; 427/255; 427/383.3; 118/716; 501/87; 501/88; 501/96; 423/289; 423/297; 423/411; 423/412; 423/439; 423/440

[58] Field of Search .................. 501/87, 88, 96; 427/217, 226, 227, 250, 251, 255, 383.3; 423/289, 297, 411, 412, 439, 440; 75/0.5 B; 118/716

[56] References Cited

U.S. PATENT DOCUMENTS

| | | | |
|---|---|---|---|
| 3,232,706 | 2/1966 | Kohn | 423/290 |
| 3,447,950 | 6/1969 | Evans et al. | 427/217 X |
| 3,485,586 | 12/1969 | Swaney | 423/440 |
| 3,666,408 | 5/1972 | Grosse et al. | 423/405 |
| 3,839,542 | 10/1974 | Chase | 501/87 X |
| 3,877,960 | 4/1975 | Knoss | 427/217 X |
| 3,992,193 | 11/1976 | Fey et al. | 75/10.22 |
| 4,022,872 | 5/1977 | Carson et al. | 423/297 X |
| 4,146,389 | 3/1979 | Karlovitz | 75/10.27 |
| 4,164,553 | 8/1979 | Perugini et al. | 501/87 X |
| 4,266,977 | 5/1981 | Steiger | 501/87 OR |
| 4,460,697 | 7/1984 | Hara et al. | 423/411 X |
| 4,484,943 | 11/1984 | Miura et al. | 75/0.5 BB |
| 4,508,682 | 4/1985 | Miura et al. | 75/0.5 B |
| 4,617,055 | 10/1986 | Miura et al. | 75/0.5 B |

Primary Examiner—William R. Dixon, Jr.
Assistant Examiner—Karl Group
Attorney, Agent, or Firm—Webb, Burden, Ziesenheim & Webb

[57] ABSTRACT

A method of making metal carbide, nitride, or boride powders and mixtures thereof by direct reduction of metal compounds comprises (a) forming a reactant mixture, (b) heating the reactant mixture to temperatures that cause solid reactants to vaporize and above which the metal precursor compounds are reduced, (c) passing the heated reactant mixture through a converging-diverging nozzle designed to reduce the temperature of the mixture to a temperature and for a time sufficient for further product species to form and for nuclei to form and grow by condensation to form the product powders, and (d) exhausting the mixture and product powders from the nozzle into an expansion chamber.

32 Claims, 4 Drawing Sheets

METHOD OF MAKING CARBIDE, NITRIDE AND BORIDE POWDERS

BACKGROUND

A number of processes have been proposed for the manufacture of submicron carbides, nitrides, borides and other compounds by gas phase reactions at elevated temperatures. The reactants are usually heated by plasma arc techniques in which a gas is heated as it is passed though an arc.

In U.S. Pat. No. 3,232,706 a process of making submicron carbides and nitrides by vaporizing at least one solid reactant in a furnace created between two non-consumable electrodes is disclosed. The particulate product is swept from the furnace by a sweep gas.

In U.S. Pat. No. 3,485,586 a process of making submicron titanium carbide is described in which a titanium halide in vapor state is reacted with a source of carbon, halogen and hydrogen. Hydrogen is heated by passing through an electric arc and the titanium chloride and the source of carbon, etc. are fed into the hot hydrogen stream which is simply passed into a settling chamber and then to a bag filter, electrostatic precipitator or other means for separation of powders from gasses.

In U.S. Pat. No. 3,992,193 a process of making metal powder by direct reduction in an arc heater is described. A suggested cooling method is quenching the already formed droplets of metal by passing through a nozzle.

In U.S. Pat. Nos. 4,022,872 a process of preparing finely-divided borides, carbides, silicides, nitrides and sulfides of metals and metalloides by reaction in the gas phase of a vaporous halide of the metal or metalloid and a reactant gas containing a source of the non-metallic element with which the metal or metalloid is to be reacted is disclosed. Heating is by hydrogen plasma arc. The reactants are mixed with the heated gas stream along with a cooler inert gas to cancel the swirling action of the plasma arc.

In U.S. Pat. No. 3,666,408 a process for the production of oxides of nitrogen is disclosed in which the nitrogen and oxygen are reacted in a plasma created by electric arc discharge. The resultant gaseous reaction mixture is cooled to below the dissociation temperature by expanding the plasma through a nozzle and contacting the expanded reaction mixture with cooler recycle gas.

In U.S. Pat. No. 4,146,389 a process for thermal reduction of alumina to aluminum in which the reactants are heated in a dispersed electrical discharge reactor is described.

No prior art process of which the applicant is aware teaches heating reaction mixtures at plasma temperatures followed by condensation of solid reaction products from the mixture by cooling in an expansion nozzle. In the process wherein nitric oxide is fixed from air or nitrogen and oxygen mixtures the product is gaseous. Moreover, the reaction has taken place before the mixture enters the nozzle. Also, nitric oxide has an anomalous behavior enabling it to cool vibration modes of molecular energy storage about 1000 times after than most other diatomic molecules. It is necessary to cool vibrational modes to arrest undesired reactions. Hence, it cannot be expected that nozzle cooling will be effective in cooling reaction mixtures to avoid back reactions for all conceivable processes.

In the applicant's process disclosed herein chemical reaction, nucleation, and condensation of solid particles all take place in the cooling nozzle and in a way to avoid undesired reactions. An essential aspect of the applicant's process is providing in the reaction mixture a low molecular weight gas that has the ability to enable transfer of energy from vibrational modes of molecular energy storage. Another essential aspect of the applicant's process is the provision of an inert gas in the reaction mixture that, while at the temperature of the remainder of the mixture passed into the nozzle, provides a sink for exotheraic condensation reactions and the latent heat of condensation in the nozzle.

SUMMARY OF THE INVENTION

It is an object according to this invention to use a heated reactor and a converging-diverging nozzle to provide a non-equilibrium gasdynamic technique for materials processing.

It is another object according to this invention to provide a method of making metal carbide, nitride, or boride powders and mixtures thereof by direct reduction of metal coapounds in an electrically heated reactor such as a dispersed electric discharge reactor with further reaction, nucleation and condensation of the powders in a converging-diverging nozzle.

It is a still further object of this invention to provide a method of making metal carbide powders by direct reduction of metal compounds such as metal oxides.

It is a yet further object of this invention to provide a method of making metal carbide, nitride, or boride powders and mixtures thereof having a metal coating over the surface thereof.

It is yet another object of this invention to provide an apparatus for continuously making metal carbide, nitride, or boride powders and mixtures thereof by direct reduction of metal compounds.

Briefly according to this invention metal carbide, nitride, or boride powders and mixtures thereof are prepared by direct reduction of metal compounds. The first step comprises forming a reactant mixture comprising one or more metal compounds, a source of carbon sufficient to reduce the metal compound, a source of carbon, nitrogen, or boron or mixtures thereof sufficient to react with substantially all of the reduced metal, a small amount of gas or source of a gas selected from hydrogen or helium and mixtures thereof, and a heat exchange gas being substantially inert with respect to the product powders which gas may be selected from argon, helium and hydrogen among others. The next step comprises heating the reactant mixture to temperatures that cause the solid reactants to vaporize and above which the metal compounds are reduced and above which the rate of nucleation and subsequent condensation of the product powders is slow enough such that no significant condensation takes place in the reactor. The next step comprises passing the heated reactant mixture through a converging-diverging nozzle designed to reduce the temperature of the mixture to a temperature and for a time sufficient for nuclei to form and grow by condensation to form the product powders. The final essential step comprises exhausting the mixture and product powders from the nozzle into an expansion chamber in a manner to reduce the total enthalpy of the mixture and powders to quickly lower the temperature of the powders sufficiently that the rate of undesired reactions is insignificant. The powders are then recovered.

A preferred embodiment of this invention comprises preparing metal carbide powders by direct reduction of metal compounds. In this embodiment, the reactant mixture comprising the metal compound, a source of carbon sufficient to reduce the metal compound and a source of carbon sufficient to react with substantially all of the reduced metal. The converging-diverging nozzle is designed to reduce the temperature of the mixture to a temperature and for a time sufficient for additional carbides to form and for nuclei to form and grow by condensation to form the product metal carbide powders. The metal carbide product powders are exhausted from the nozzle into an expansion chamber in a manner to reduce the total enthalpy of the mixture and powders to quickly lower the temperature of the powders sufficiently that the rate of undesired reactions is insignificant.

An especially preferred embodiment of this invention comprises preparing metal carbide powders by direct reduction of metal oxides. In this embodiment the reactant mixuure comprising the metal oxide, a source of carbon sufficient to reduce the metal oxide and sufficient to react with substantially all of the reduced metal. For making carbides of the group IVb transition metals including titanium, zirconium and hafnium, the oxide in powdered form comprises an oxide selected from the group IVb transition metals. For making carbides of the group Vb transition metals including vanadium, niobium, and tantalum, the oxide in powdered form comprises an oxide selected from the group Vb transition metals. For making carbides of the group VIb transition metals including chromium, molybdenum, and tungsten, the oxide in powdered form comprises an oxide selected from the group VIb transition metals. For making aluminum carbide, the oxide in powdered form comprises an oxide of aluminum. For making silicon carbide, the oxide in powdered form comprises an oxide of silicon. The carbon source is preferably a gaseous hydrocarbon such as methane.

In all embodiments of this invention, the amount of inert gas in the mixture must be sufficient to absorb sufficient heat of condensation during the expansion through the nozzle to enable the condensation to continue. Preferably, the mole ratio of inert gas to metal oxide in the mixture is between 0.1:1 and 10:1 and most preferably at least 1:1. The inert gas may be selected from the group, Argon, Helium, Hydrogen and in some cases Nitrogen.

In all embodiments of this invention the gas selected from hydrogen and helium must be present in sufficient amount such that as the mixture is passed through the nozzle energy stored in vibrational modes is sufficiently rapidly transferred to other energy storage modes such that vibrational temperature are reduced and subsequently reaction rates and condensation rates, which are strongly dependent on vibrational temperatures, are reduced and condensation proceeds and undesired reactions are reduced. Preferably, the gas selected from hydrogen and helium in the reactant mixture is present between 5 and 75 mole percent.

In a special embodiment of this invention, the product powders are coated with a coating metal. To this end, a source of a coating metal is added to said reactant mixture. The coating metal must be vaporizable and relatively inert with oxygen and carbon at the temperature of the reactor and have a vapor pressure higher than the product powders such that after substantially all of the product powders have condensed from the reactant mixture in the nozzle the coating metals condense on the surface of the product powders. The coating metals may be selected from the group comprising copper, gold, silver, tin, zinc, aluminum, cadmium, indium and mixtures thereof. The coating metals may also be selected from metals in the lanthanide and actinide series having suitably high vapor pressures and mixtures thereof. The coating metal may be the same metal or metals from which the carbide, nitride, or boride substrate powders are formed.

For embodiments in which nitrides are formed, ammonia may be added to the mixture as a source of nitrogen and hydrogen. For embodiments in which borides are formed, hydride of boride may be added to the mixture as a source of boron and hydrogen.

For all embodiments the mixtures are heated in excess of 2,000 degrees Kelvin and, preferably, in the range 3000 to 4500 degrees Kelvin prior to passing through the nozzle. Generally speaking the temperature of the metal powders in the expansion chamber are reduced to below 1000 degrees Kelvin. Generally speaking, the pressure on the inlet side of the nozzle is between 2 and 60 atmospheres.

Briefly according to this invention there is provided an apparatus for continuously making metal carbide, nitride, or boride powders or mixtures thereof by direct reduction of metal compounds which comprises (a) an electrically heated reactor such as dispersed electrical discharge reactor into which powdered and gas reactants may be introduced and raised to a temperature in excess of 2000 degrees Kelvin (b) a converging-diverging nozzle having an inlet end in communication with the reactor, said nozzle having an orifice between 0.1 and 5 cm in radius and a length of between 0.2 and 2 meters, and an L value in the diverging section between 5 and 35, (c) an expansion chamber into which the nozzle exhausts having nozzles extending therein for introducing co-flowing heat exchange gases with the exhaust from the nozzle and means for evacuating a mixture of gases and powder from the expansion chamber to lower the pressure of the expansion chamber below the outlet pressure of the nozzle, and (d) apparatus, such as electrostatic precipitators for recovering powders from the mixture exhausted from the expansion chamber.

According to a most preferred embodiment, a catalytic reactor is provided in communication with the apparatus for recovering powders from the mixture into which the gases separated from powders are passed to cause reactive components to react and condense. Conduit are then provided for returning gases exhausted from the catalytic converter to either the discharge reactor or the exhaust chamber as heat exchange gases.

Preferably, the reactor is designed to maintain a strong turbulence therein as by tangentially directing the inlet gases and powders in to the reactor having a cylindrical configuration. The size of the reactor in a continuous process is such that the characteristic residence time in the discharge reactor is about one second.

Preferably, the nozzle orifice area to outlet area ratio $(A/A^*)$ is at least 2. Preferably the orifice area to inlet area ratio $(A/A^*)$ is between 5 and 100 such that inlet flow from the reactor is initially at a low speed.

DESCRIPTION OF THE DRAWINGS

Further features and other objects and advantages of this invention will become apparent from a study of the following portions of the specification with reference to the drawings in which.

DESCRIPTION OF THE PREFERRED EMBODIMENT

Apparatus

Figure 1:
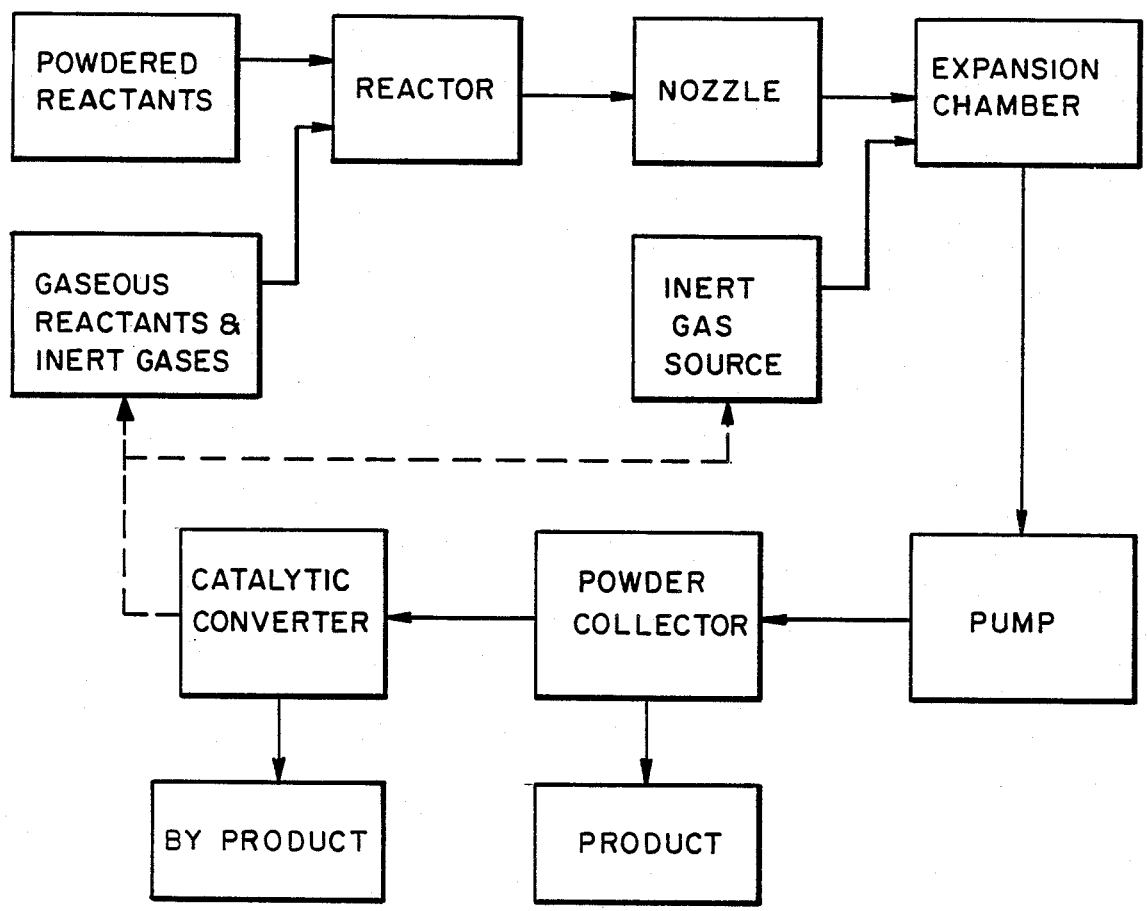
FIG. 1 is a block diagram showing the functional relationships of apparatus components useful in the practice of this invention.

Referring now to FIG. 1, there is shown the functional relationship of apparatus useful in the practice of this invention along with the functional relationship of material sources, product and by-product collection, and, optionally, recirculation of certain inert gases.

The reactor heats the particulate and gaseous reactants to a desired temperature and pressure and for a time long enough for equilibrium to be reached. The reactor is a dispersed electric discharge reactor which is different from an electric arc furnace in that there are no arc filaments. The current is thus evenly dispersed through the reactor and the reactants. An electric arc is prevented in the reactor by maintaining a high level of turbulence. The reactor is characterized by a high power density and an even heating of the reactants. In a preferred reactor, the high gas velocities needed to maintain the turbulence level are generated by injecting jets of the reactant gases into the reactor to provide a bulk swirling motion. The outlet of the reactor is at the center of the vortex and the centrifugal forces of the rotation serve to keep the larger particles in the system until they are vaporized. A suitable design for a reactor useful in the practice of this invention is disclosed in Karlovitz et al. U.S. Pat. No. 4,146,389. The reactor must be able to contain the reactant mixture heated to temperatures in the range 2000 to 4000 degrees Kelvin and to contain pressure up to 100 atmospheres.

The fully vaporized equilibrium mixture of reactants are passed out of the reactor and expanded in a converging-diverging nozzle during which time certain non-equilibrium process take place. The shape and size of the nozzle has a very large effect on the behavior of the flow through it. Nozzles may be characterized by the throat radius, inlet and outlet radii, and inlet and outlet cone angles. For the purposes of this application, in the region near the throat, the nozzle curvature is assumed to be circular in cross-section with a radius equal to three times the throat radius. The converging section is assumed to be a straight cone. In real nozzles there may be some curvature. The outlet geometry of the nozzles may be defined by the following equation where in L is a parameter that characterizes the outlet cone.

$$A/A^* = 1 + (x/L)^2$$

Here, x is the distance away from the throat of the nozzle, $A^*$ is the area of the throat, A is the area of the nozzle at distance x and L is defined as $$L = r/\tan \phi$$

where r is the throat radius and is the half angle $\phi$ of the asymptotic one.

The factor L is a good method of characterizing nozzles since it relates both throat radius and cone angle effects. Cooling rates for nozzles with equivalent throat areas, vary inversely with the value of L. For nozzles with throat radii on the order of 1 cm, L varies from 1 to 10. For larger nozzles L varies from about 5 to 100.

Figure 2:
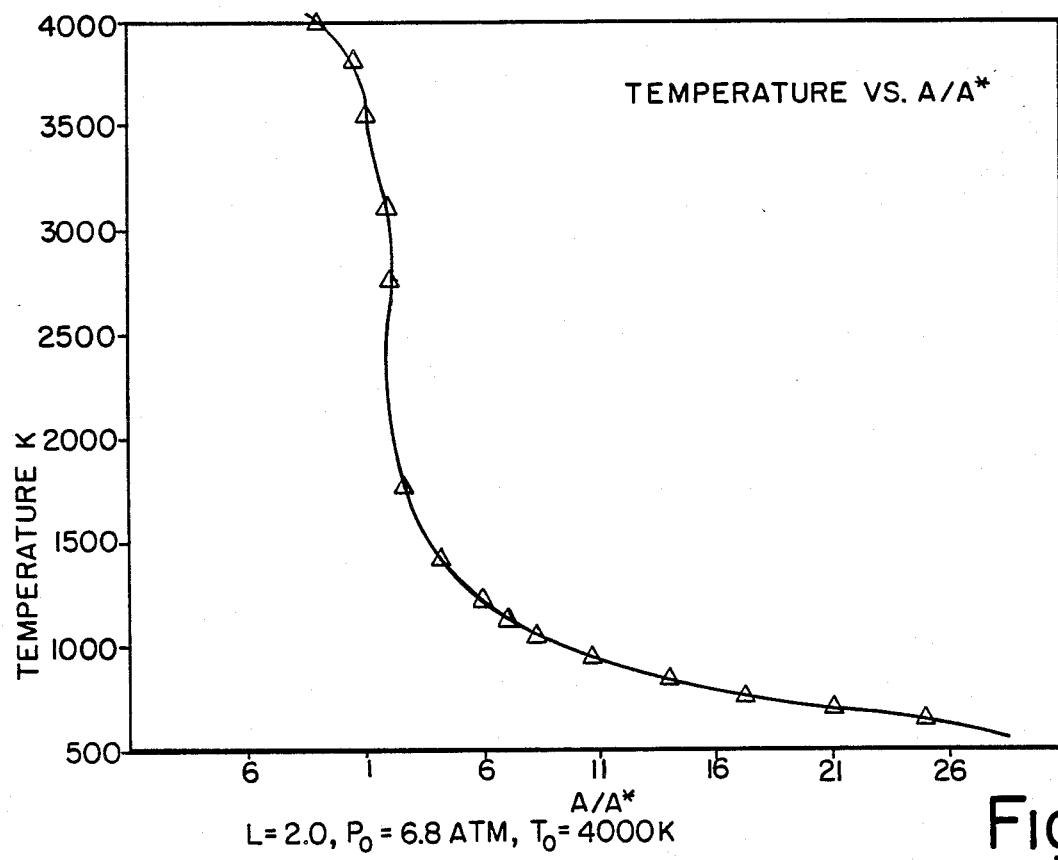
FIG. 2 is a graph showing the temperature drop of an ideal gas expanded through a nozzle at initial temperatures and pressures similar to those used in this invention.
Figure 3:
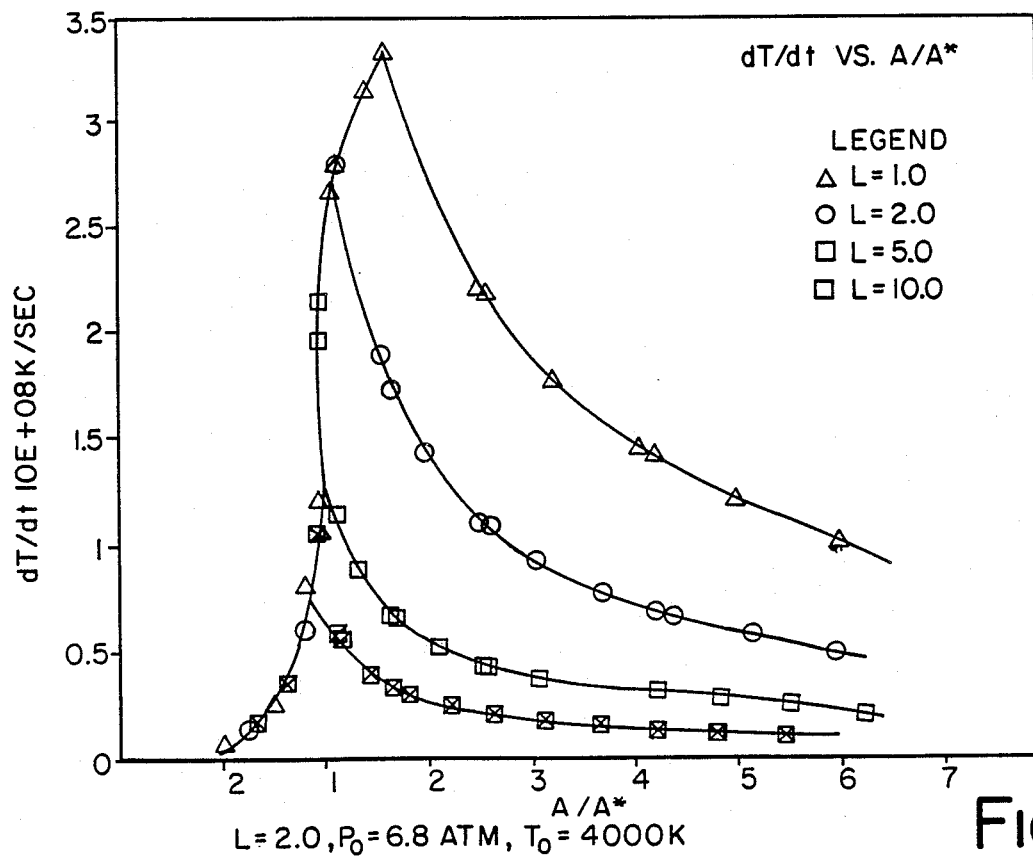
FIG. 3 is a graph showing the rate of temperature drop versus position of an ideal gas for nozzle configurations at initial temperatures and pressures similar to those used in this invention.

The rate of cooling through a nozzle at the temperatures and pressures typical of this process were calculated and are plotted for ideal gases in FIGS. 2 and 3. The processes being described are far from non-reacting ideal gases expanded in a nozzle since condensation actually takes place in the nozzle but the data for ideal gases is a good starting point for understanding cooling through a nozzle at supersonic speeds. FIGS. 2 and 3 show the rapid rate of temperature change through the nozzle which is at its maximum near the throat. By varying nozzle geometry, it is possible to have some degree of control over the rate of cooling in the system. This is particularly important in the formation of microfine powders because particle size, stoichiometry, crystalline structure and shape are strongly affected by the rate of cooling and pressure change.

There is a materials limitation on the reactor and nozzle with regard to both temperature and pressure. It would appear that at the temperatures and pressures indicated for the reactor above, with cooling of the reactor and the nozzle, the life of these components would be adequate considering the high mass flow rates during operation.

The reactor may be directly connected to the inlet side of the nozzle or separated by an insulated conduit in order to better isolate the nozzle from fluctuations in the reactor.

Referring again to FIG. 1, the outlet side of the nozzle is connected to an expansion chamber. Flow through the nozzle is substantially adiabatic and the total enthalpy of a fluid particle does not change during the process. As temperature and pressure drop, the flow velocity increases and the energy is transferred from the molecular modes of energy storage to bulk kinetic energy. The exit flow from the nozzle may be on the order of several thousand meters per second. If the speed were rapidly decreased (or shocked) the products would be reheated with potentially adverse effects. The expansion chamber has a pressure that is less than the outlet pressure of the nozzle. A set of secondary nozzles around the exit of the main nozzle discharges cool gas which is inert with respect to the products in the converging-diverging nozzle. The mixing of the two stream is very rapid due to a high level of turbulence. Cooling in the expansion chamber is aided by the presence of the hydrogen and/or helium added in the reactor. This will lower the enthalpy of the products to a point where reheating on deceleration would be to a temperature less than the critical temperature. Hence, undesired reactions are avoided. The exit flow from this chamber is a high volume lower speed flow which results in the low pressure in the expansion chamber. The exit flow is maintained by pumps, for example, centrifugal pumps.

As shown in FIG. 1, the output of the pumps is directed to a powder collector which may be an electrostatic precipitator, bag filter or other common method of separating fine powders from gas streams.

There are several major differences between the system shown in FIG. 1 and prior art systems based primarily on an inert gas arc which is maintained separately from the reactants. In those systems the reactants are added to the carrier gas by a small side stream. Thus, the reactants are only a small fraction of the total mass. The bulk of the flow is usually Argon. The residence time of the reactants in the arc, if indeed they pass through the arc, is on the order of a millisecond since the arc is small and the reactants pass quickly through it. Powdered solid reactants require a certain residence time in order to entirely vaporize. Particles on the order of 50 microns in diameter will take 50 milliseconds or more to vaporize in an arc. For powders, say 325 mesh (44 microns), this is much longer than the residence time in the arc.

In the applicant's process the residence time in the reactor is essentially unlimited and the reactants account for all or at least a major part of the mass of the system. This, of course, minimizes the energy required per unit weight of product. Moreover, a long residence time in the reactor results in a more homogeneous reactant mixture.

Theoretical Process Considerations

At equilibrium, the concentrations of the individual species in a chemical system are determined by the temperature and the pressure of the system. If the temperature or pressure are changed, the species concentrations will adjust until the system is again at equilibrium. In most situations, the characteristic time for a hot gas phase system to reach a new equilibrium is much less than the characteristic time for the overall change of temperature or pressure such that the system is always substantially at equilibrium. However, if the rate of change of temperature is extremely rapid, the system may not have time to readjust itself and it becomes possible to maintain the species concentrations of the system far from equilibrium during the change. Under certain conditions, these non-equilibrium chemical concentrations can be frozen into the products.

Under the proper conditions, when a gas is expanded through a converning-diverging nozzle, the velocity increases continually through the nozzle. The velocity reaches the sonic point at the throat and is supersonic in the diverging section. As the velocity increases, the temperature and pressure drop.

The average rate o temperature change through a supersonic nozzle can be on the order of ten million degrees Kelvin per second. Additionally, nozzles are also characterized by high rates of mass flow. In this invention, expansion through a converging-diverging nozzle is used to produce the high rates of temperature change.

The highest rate of temperature change through a nozzle occurs near the throat where the temperature change rate may be on the order of 50 million degrees Kelvin per second. A characteristic residence time in this region is on the order of $10^{-5}$ seconds. This is shorter than the characteristic time for many chemical reactions and consequently there may be a large departure from chemical equilibrium. Both the temperature and the density of the system are decreasing rapidly during this time and there is a subsequent decrease in reaction rates which are strong functions of both temperature and pressure. Because of this, it is possible to freeze in certai chemical species which would normally be consumed by reaction if the temperature change process were to occur on a slower scale.

In molecules, energy is stored in translational, rotational, electronic and vibrational modes. Normally the distribution of energy among these modes is a Boltzmann distribution and the relative population of a given state in any mode is proportional to $$E^{-\epsilon/KT}$$

where, $\epsilon$ is the energy associated with that state.

As the temperature of a gas is lowered, the distribution of energy in the system will move toward a new equilibrium distribution of energy in accord with the ambient temperature. Translational and rotational modes equilibrate to the ambient, or bath, temperature very quickly. Typically, relaxation for those modes is within svveral molecular collisions. The transfer of energy from vibrational modes, on the other hand, is usually an inefficient process which may require 10 to $10^{+10}$ times as many collisions to transfer energy to other modes. This means, vibrational equilibration can take many orders of magnitude longer than rotational or translational relaxation and also, characteristic times for vibrational relaxation can be slow compared to the residence time in the nozzle. Consequently, vibrational temperatures can be much higher than the bath temperature of the gas during the expansion.

Chemical reaction rates, specific heats and enthalpies are all functions of both vibrational and bath temperature of the molecules. Chemical reaction, vibrational non-equilibrium and condensation can act as heat sources or sinks for the flow. As a result the chemical, vibrational and phase changes are coupled to each other as well as to the flow through the nozzle.

The rates of vibrational relaxation vary exponentially with the cube root of the reduced mass of the collision partners. According to this invention, the addition of a light molecule to a mixture can significantly increase the rate of vibrational relaxation and reduce the difference between vibrational and bath temperature.

In applicant's process, nucleation and condensation take place in the nozzle. Nucleation theory is still not a well developed field. There is the so called classical method of estimating nucleation rates, however, it is universally accepted that this theory is lacking. The classical theory holds that the microclusters which form during nucleation behave according to the capillarity approximation. Nuclei which form need to be of a certain size in order to be stable. Nuclei which are smaller will eventually fall apart and nuclei which are larger will grow. The problem with the classical approximation is that the microclusters, which generally have on the order of 10 to 100 molecules, do not behave like the bulk liquid. The formation of these microclusters is a fluctuation process. There are a number of different approaches to correcting the problem. Most rely on trying to use a statistical mechanical approach to calculating the equilibrium constant for the system. Generally, the classical rate is calculated and then corrected with a so called replacement free energy factor. Experimental values of this factor vary from about $10^{-10}$ to about $10^{+9}$. Experiment by others also seems to indicate that the replacement factor is a function of the type of molecule, rate of cooling and the degree of dilution by inert gas. The experiments which were closest to this work suggested a factor between 1.0 and $10^3$ and independent theoretical works, suggest a factor of this order. In this work, the replacement factor was varied from $10^{-2}$ to $10^{+5}$. It was found that there was very little effect on the results when the replacement factor was varied between 1.0 and $10^{+5}$.

Mathematical Modeling of the Preferred Process Embodiment

The applicant has mathematically modeled the reaction of titanium dioxide and methane in the presence of argon heated and pass through a nozzle to condense the titanium carbide. The results of this work indcate that microfine particles (on the order of 0.001 to 0.1 $\mu$m) of the metal carbide could be produced.

Because of the relatively large amount of computer time required to model the flow through a nozzle, only a few different combinations of nozzle geometry, initial conditions and other variables were modeled. These combinations were chosen to try and best represent the process. Physical considerations included initial temperature of the reactants, the amount of inert gas dilution and the nozzle geometry.

The modeling program was run with different values for these variables to investigate their effects. For all these runs, the throat diameter was fixed at 1.0 cm and the overall length for a nozzle was about 70 cm depending on the L value of the exit cone. Because of the potential for undesirable reactions, the condensation process was designed to be complete before the temperature dropped to 1600 degrees Kelvin. The reaction of TiC(c) and CO(g) to produce TiO(c) and $C_2$(c) becomes thermodynamically favored at about 1500 degrees Kelvin. According to this invention, the flow should exit the nozzle and enter the expansion chamber to be quenched quickly to temperatures below 1600 degrees Kelvin.

The first variable considered was the initial temperature of the reactants. From a practical standpoint, the lower the initial temperature the better since there is a materials consideration for reactor construction and the power input required depends on initial temperature. The other side to this is that if the initial pressure is low, then the pressure on the exhaust side will be correspondingly low requiring more pump work.

Starting at lower temperatures and working upwards showed that at about 3800 degrees Kelvin there is a significant vapor pressure of TiC, (0.31 atm), in the reactants and a reasonably high total pressure (6.6 atm). These pressures may be above equilibrium saturation pressures at the given temperatures. The pressures are higher because the metal source which has a higher vapor pressure is first vaporized and the carbide, nitride, or boride product is formed in the gas phase and conditions are such that insignificant nucleation and condensation take place. Lower temperatures had correspondingly lower total pressures. Initially, expansion ratios for the condensation to occur where unknown and it was desired to use a higher initial pressure to avoid unreasonably low exit pressures. For this reason, to maintain higher pressures the temperatures initially considered were 3800 and 3900 degrees Kelvin. At 3900 degrees Kelvin the vapor pressure of TiC was 0.48 atm and the total pressure was 10.3 atm.

The process was modeled using these two temperatures, with the same initial stoichiometry and nozzle geometry. The replacement factor was set equal to one for this test. The results are given in Table 1.

TABLE 1

Effect of initial temperature on condensing flow

| Initial Conditions | | | |
|---|---|---|---|
| $L_{in}$ = 1.0 | $L_{exit}$ = 10.0 | Replacement Factor = 1.0 | |
| | $CH_4/TiO_2$ = 3.0 | $Ar/TiO_2$ = 0.0 | |
| Temperature | | 3800° K. | 3900° K. |
| $P_O$, initial total pressure | | 6.55 | 10.3 atm |
| $PP_{TiC}$, partial pressure TiC | | 0.305 | 0.483 atm |
| Supersaturation $_{TiC}$ | | 12.8 | 11.2 |
| $PO$, initial density | | 0.2477 | 0.7372 Kg · m$^3$ |
| Nozzle Exit Conditions | | | |
| Particles size | | 0.026 | 0.039 $\mu$m |
| Ti(g)$_{1600}$ | | 2.0 | 1.7% |
| $(A/A^*)_{1600}$ | | 25 | 26 |
| $P_{1600}$, exit total pressure | | 0.0232 | 0.0344 atm |

Note:
The reference to 1600 is the point in the flow where the temperature was 1600 degrees Kelvin, flow was not followed past this point since this was the temperature where undesired reaction would begin. Ti(g) is the percentage of uncondensed titanium remaining in the gas phase.

The size of the particles produced in each of the runs are on the same order of magnitude. The titanium does not condense out completely in either to these flows before the temperature falls to below 1600 degrees Kelvin. There is still approximately 2 percent of the titanium which stays in the vapor phase. The system with the higher initial temperature had a smaller amount of titanium remaining in the gas phase so this temperature was used for the rest of the study.

The process was modeled to consider the degree of dilution by an inert gas with constant initial temperature and nozzle geometry. The results are shown in the Table 2

TABLE 2

Effect or inert gas addition on condensing flow

| Initial Conditions | | | |
|---|---|---|---|
| $L_{in}$ = 1.0 | $L_{exit}$ = 10.0 | Replacement Factor = 1.0 | |
| | $CH_4/TiO_2$ = 3.0 | $T_o$ = 3900° K. | |
| $Ar/TiO_2$ | 0.0 | 3.0 | 6.0 |
| Mass fraction Ar | 0.0 | 0.483 | 0.652 |
| mole fraction Ar | 0.0 | 0.218 | 0.363 |
| Nozzle Exit Conditions | | | |
| Particles size | 0.039 | 0.035 | 0.034 $\mu$m |
| Ti(g)$_{1600}$ | 1.7 | 0.38 | 0.15% |
| $(A/A^*)_{1600}$ | 26 | 15 | 11 |
| $P_{1600}$ | 0.0344 | 0.078 | 0.141 atm |

Figure 4:
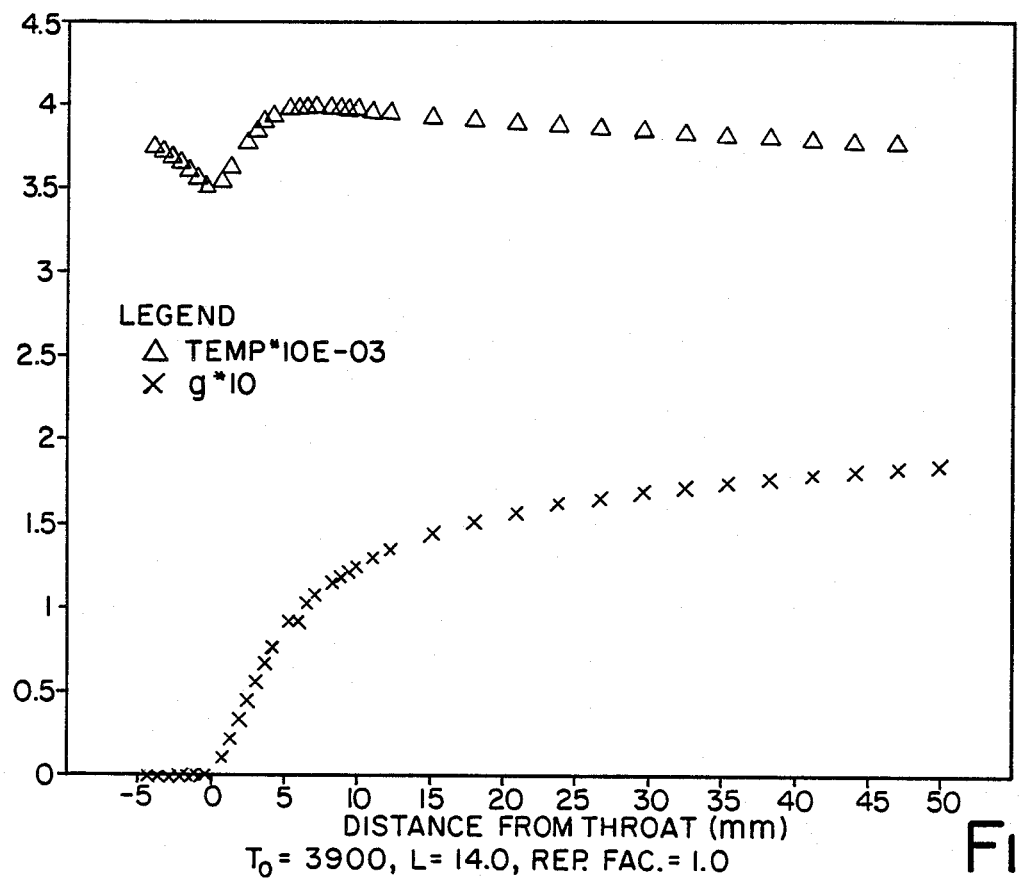
FIG. 4 is a graph of temperature and mass fraction condensed versus distance from the throat of a nozzle obtained by mathematically modeling a preferred embodiment of this invention.

Here it can be seen that the addition of an inert gas caused the condensation process to go to completion much sooner in the flow and at a higher temperature. The reason for this effect is that the inert gas acts as a heat sink during the condensation process. There is a good deal of heat added to the flow from the heat of condensation as well as chemical reaction. Even though initially titanium and carbon do not condense, TiC does condense out rapidly and this causes a large chemical imbalance which favors the reaction of Ti and $C_2$ to produce TiC and C. This is an exothermic reaction and this in addition to the heat of condensation effectively act as a heat source to the flow. The effect of this can be seen in FIG. 4 which shows a plot of temperature versus mass faction condensed. In this case, the temperature actually rises slightly above the initial temperature of the reactants. It is the sensitivity of nucleation to temperature which allows the addition of an inert gas to have such a marked effect.

It is important that condensation proceeds at a high temperature because of possible undesired reaction with CO to form the metal oxide. These results indicate that the addition of a 3 to 1 ratio of argon to $TiO_2$ in the initial reactants would be sufficient to increase the heat capacity of the mixture to a level which would allow condensation to be completed at a temperature high enough to avoid this undesired reaction. Table 2 shows that the addition of more inert gas causes the condensation to be completed sooner in the flow but with only a small effect on particle size and remaining gas phase Ti. Because the addition of an inert gas represents an increase in the amount of energy required for the process, a dilution ratio of 3:1 Ar to $TiO_2$ was used for the rest of the study.

Figure 5:
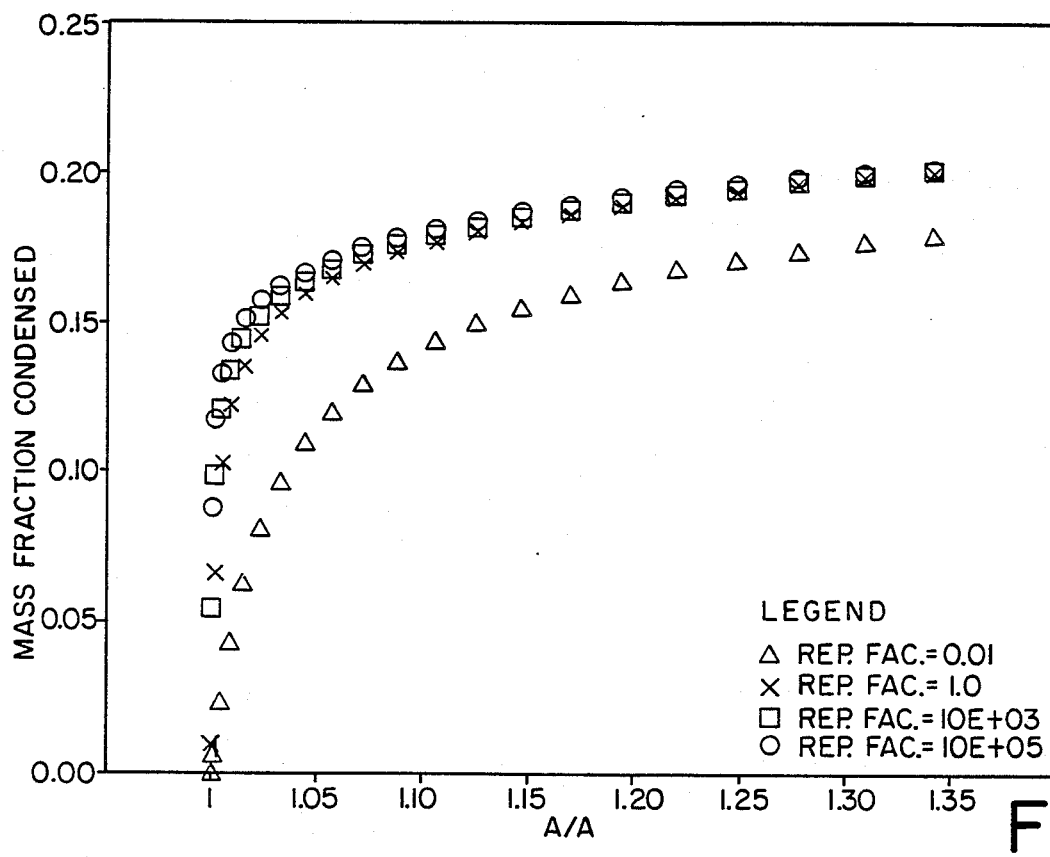
FIG. 5 is a graph of mass fraction condensed versus $A/A^*$ for four different replacement factors indicative of nucleation and condensation rates.

The next point to be considered was the replacement factor. A range of values from $10^{-2}$ to $10^{+5}$ could be inferred from prior experimental data which characterizes nucleation and condensation. To investigate the effect of the replacement factor, the process was modeled with the initial temperature set at 3900 degrees Kelvin, a dilution ratio of 3.0, and a nozzle exit L value of 10.0 and the replacement factor was varied. The results are listed in Table 3 and are shown qualitatively in FIG. 5.

TABLE 3

| Effect of replacement factor on condensing flow | | | | |
|---|---|---|---|---|
| Initial Conditions | | | | |
| $L_{in} = 1.0$ | $L_{exit} = 10.0$ | | $T_O = 3900°$ K. | |
| | $CH_4/TiO_2 = 3.0$ | | $Ar/TiO_2 = 3.0$ | |
| $\Gamma_{rep}$ | $10^{-2}$ | 1.0 | $10^{+3}$ | $10^{+5}$ |
| Nozzle Exit Conditions | | | | |
| Particle size | 0.0945 | 0.035 | 0.035 | 0.035 $\mu$m |
| $Ti(g)_{1600}$ | 3.165 | 0.38 | 0.40 | 0.37% |
| $(A/A^*)_{1600}$ | 17 | 15 | 16 | 15 |
| $P_{1600}$ | 0.0713 | 0.078 | 0.078 | 0.080 atm |

Figure 6:
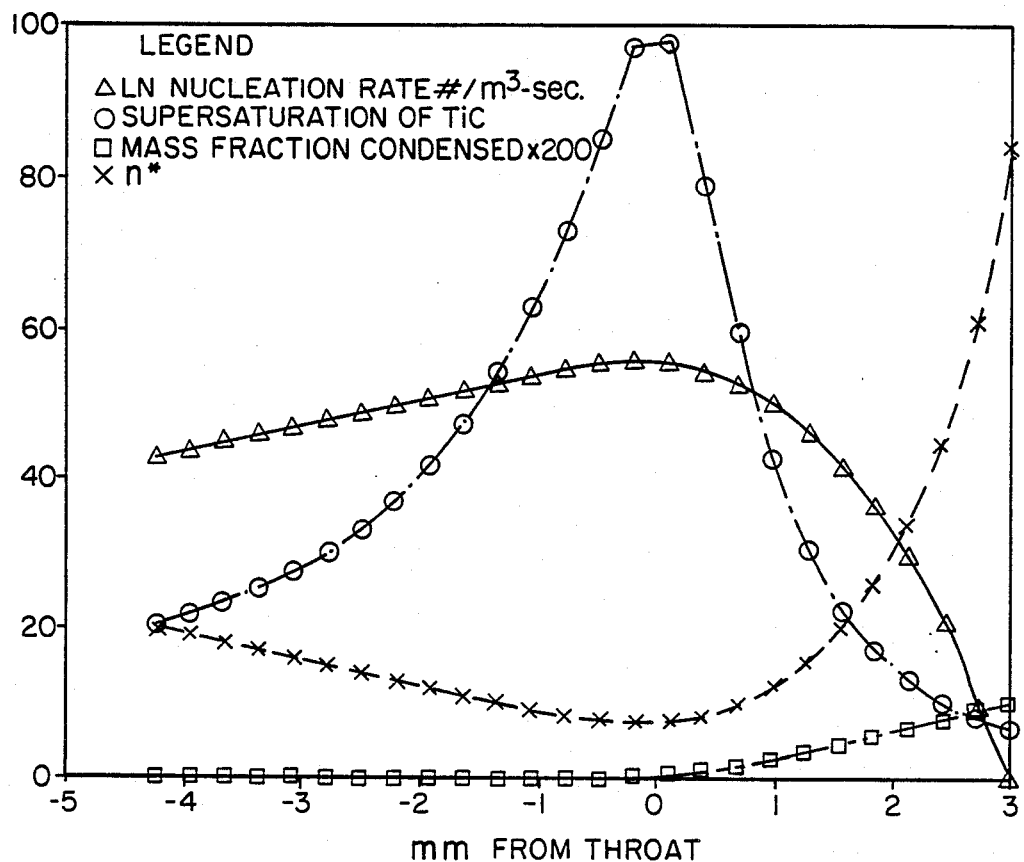
FIG. 6 is a graph illustrating supersaturation, nucleation and condensation rates versus distance from the nozzle throat obtained by mathematically modeling a preferred embodiment of this invention.

The results are somewhat surprising in that, with the exception of the low value, $10^{-2}$, the rate of nucleation and the final particle size show very little variation. Ignoring the low value for the moment, the only effect five orders magnitude difference in the replacement factor makes in the results is to shift the location of maximum nucleation by about 3 mm in the nozzle. This may be explained by looking to FIG. 6. This graph shows several things, but the most important is that nucleation occurs extremely quickly and over only a small range. (The initial conditions for the model set forth in FIG. 6 are $T_o = 3900$ degrees Kelvin, $L = 14.0$, $R = 1.0$, $CA_{4/TiO2} = 3.0$ and $Ar/TiO_2 = 3.0$.) Almost all nuclei are formed at this time and only very few appear elsewhere in the flow, the rest of the process is primarily condensation to these existing nuclei. The particle size is then principally a function of the number of nuclei formed during the peak rate.

Table 4 shows a comparison of the peak nucleation rates and the locations in relation to the throat for the system using different replacement factors.

TABLE 4

| Effect of replacement factor on peak nucleation rates | | | | |
|---|---|---|---|---|
| Initial Conditions | | | | |
| $L_{in} = 1.0$ | $L_{exit} = 10.0$ | | $T_O = 3900°$ K. | |
| | $CH_4/TiO_2 = 3.0$ | | $Ar/TiO_2 = 3.0$ | |
| $\Gamma_{rep}$ | $10^{-2}$ | 1.0 | $10^{+3}$ | $10^{+5}$ |

TABLE 4-continued

| Effect of replacement factor on peak nucleation rates | | | | |
|---|---|---|---|---|
| $J_{cl}$ | $4.6 * 10^{24}$ | $2.0 * 10^{24}$ | $1.5 * 10^{21}$ | $1.5 * 10^{19}$ |
| Actual rate | $4.6 * 10^{22}$ | $2.0 * 10^{24}$ | $1.5 * 10^{24}$ | $1.5 * 10^{24}$ |
| $n^*$ | 6.6 | 7.1 | 13.5 | 18.4 |
| location | $-.09$ | $-.01$ | $-2.196$ | $-3.49$ mm |

Note:
$J_{cl}$ is the classical nucleation rate, the actual rate is $J_{cl}$ times the replacement factor. $N^*$ is the minimum number of molecules required to form a stable nucleus at the peak rate of nucleation and location is the distance from the throat.

The actual nucleation rates, $(J_{cl}*R_{rep})$, are all very close for the larger three replacement factors which indicates that about the same number of initial nuclei form. The size of these nuclei at formation is unimportant since they will grow essentially without competition because virtually no other nuclei form during the process. This would explain the independence of particle size on replacement factor.

Particle shape may not be spherical but may have shapes such as whiskers with length over diameter ratios as high as 100 depending upon the crystal structure of the condensing species.

The next question considered was the effect of nozzle geometry on the condensation process. The process was modeled with a nozzle exit L value of 10.0 was used. This corresponds to an asymptotic cone angle of about 2.86 degrees which is a fairly shallow angle. The inlet geometry was not varied and is not important because it has only a secondary effect on the flow. In the flow, very little happens until right near the throat. Up till this point, there is only a small change in temperature, pressure and concentration and nucleation does not occur. It is in the region near the throat that where rate of temperature change is the highest and nucleation begins. The inlet geometry has little effect on the variation in area in the region near the throat. An inlet L value of 1.0, which corresponds to a half angle of 26.6 degrees, was used in all the data runs. This value is fairly typical of similar nozzle applications.

The outlet geometry has a large effect on the behavior of the flow since in effect it is a control on the residence time at pressures and temperatures in the nozzle. To look at the effect of nozzle geometry, a set of data was run with the exit L value varied between 5.0, 10.0, and 14,0. This corresponds to asymptotic cone angles of 5.71, 2.86 and 2.05 degrees. The results are listed in Table 5.

TABLE 5

| Effect of $L_{exit}$ factor on condensing flow | | | |
|---|---|---|---|
| Initial Conditions | | | |
| $L_{in} = 1.0$ | $T_o = 3900°$ K. | Replacement Factor - 1.0 | |
| | $CH_4/TiO_2 = 3.0$ | $Ar/TiO_2 = 0.0$ | |
| Nozzle geometry | $L = 5.0$ | $L = 10.0$ | $L = 14.0$ |
| Nozzle Exit Conditions | | | |
| Particle size | 0.0345 | 0.035 | 0.035 $\mu$m |
| $Ti(g)_{1600}$ | 1.77 | 0.38 | 0.185% |
| $(A/A^*)_{1600}$ | 16 | 15 | 16 |
| x past $x_{throat}$ | 19.4 | 37.4 | 54.2 cm |
| $P_{1600}$ | 0.075 | 0.078 | 0.076 atm |

Note:
The reference to 1600 is the point in the flow where the temperature was 1600 degrees Kelvin, flow was not followed past this point since this was the temperature where undesired reaction would begin. Ti(g) is the percentage of titanium remaining in the gas phase.

It can be seen that condensation occurs at about the same A/A* ratio for all the different L values but that there is less Ti remaining in the gas phase for the shallower cone angles. The difference is the longer residence times at the larger L values. This can be seen in Table 5 by looking at the distance past the throat where the temperature hits 1600 degrees Kelvin. The L=14.0 nozzle is approximately three times as long as the L=5.0 nozzle and has a correspondingly longer residence time.

Looking back to Table 1 shows that the size of the particles obtained is proportional to the initial concentration of the reactants. The process was modeled with the initial temperature set at 4000 degrees Kelvin and this relation also applied to these results. Initial pressure was 14.177 atm and particle size was 0.051 $\mu$m. These results indicate that the particle size is limited by the initial temperature which controls the concentration of titanium and carbon available to condense as TiC. Temperatures of 4000 degrees Kelvin and above were not considered because of materials considerations.

An initial temperature of 3900 degrees Kelvin was used in this work, although, the initial temperature could possibly be 200 degrees Kelvin lower. The choice of initial temperature in this study was originally made on the basis of the amount of uncondensed titanium in the system at 1600 degrees Kelvin. Later work with the addition of inert gas and shallower exit cones indicated that condensation could possibly be completed with lower initial temperatures.

In summation, mathematically modeling the process of this invention establishes that it should be possible to produce titanium carbide powders by direct reduction from the oxide. An initial temperature of approximately 3700 to 3900 degrees Kelvin would be needed and this particular system would require some degree of dilution by an inert gas. The nozzle geometry would have inlet L values of around 1.0 and exit L values on the order of 10.0 to 15.0 with a total length on the order of a meter for a 1.0 cm diameter throat. These conditions would produce approximately 5.0 Kg per minute of TiC powder with a mean diameter of 0.035 $\mu$m. The concentration of these particles in the exit flow is about $10^{17}$ per meter cubed and total pressure is about 0.1 atmospheres.

In this work, the use of methane as the carbon source for the reducing agent was important because it also resulted in the presence of a large mole fraction of hydrogen in the system, (about 50%). The hydrogen served several important functions in the process. It cooled the vibrational modes enough so that there was never a large departure from vibrational equilibrium and it also served to keep the droplets cooled to near the bath temperature during the nucleation and condensation processes. This had a large effect on the rates of these processes because of their temperature dependence. Another major benefit of hydrogen was that it inhibited the polymerization of carbon and the formation of soot particles. Another point to mention about the presence of hydrogen, is that the byproducts of this process are hot CO, H and $H_2$ which could be catalyzed into any number of secondary products such as plastics, alcohols or fuels.

The proposed process may have other applications than the production of transition metal carbide powders.

This process could be directly adapted for the production of transition metal nitrides as well. Here again using the metal oxide with methane as a reducing agent. This time the methane would be limited to a concentration just high enough to combine with the oxygen to form CO. Under the initial conditions, all oxygen combines with carbon and remains in this form at temperatures about 1600 degrees Kelvin. To produce the nitride, ammonia, $NH_3$, would be used as the source of nitrogen. This would also introduce a significant fraction of hydrogen into the system with presumably the same beneficial effects as before. In a similar manner a hydride of boron could be used to produce transition metal borides.

In the modeled system, TiC was the only species to nucleate. The other species condensed onto the existing TiC nuclei. This condensation process depends on the vapor pressure of the condensing species over the droplet. It was observed that Ti, which has much higher vapor pressure than either C or $C_2$, condensed out last even when the pressure of Ti in the droplet was reduced because of composition effects. The idea is that if a species such as copper was present, this species would remain in the vapor phase longer than the other species, including Ti, since its vapor pressure is much higher. It was shown that heterogeneous condensation is favored over nucleation if there are existing nuclei present. Here, when the temperature gets low enough, the copper would condense onto the TiC particles and coat them with a layer of copper. Indium, zinc and cadmium are some other elements which have high vapor pressures and could be used as well. This process could be used to produce very small fine coated particles which may then be used in powder metallurgy applications to produce materials with some unusual properties.

What I claim is:

1. A method of making metal carbide, nitride, or boride product powders and mixtures thereof by direct reduction of metal compounds comprising the steps of
   (a) forming a reactant mixture comprising one or more metal compounds, a source of carbon sufficient to reduce the metal compound to form metal, a source of carbon, nitrogen, or boron or mixtures thereof sufficient to react with substantially all of the metal formed by reduction, a small amount of gas or source of a gas selected from hydrogen or helium and mixtures thereof, and a heat exchange gas being substantially inert with respect to the product powders which gas may be selected from helium, argon, nitrogen and hydrogen, a source of a coating metal being added to said reactant mixture, said coating metal being vaporizable at the temperature to which the mixture is heated and having a vapor pressure higher than the product powders,
   (b) heating the reactant mixture to temperatures that cause the solid reactants to vaporize and above which the metal compounds are reduced,
   (c) passing the heated reactant mixture through a converging-diverging nozzle designed to reduce the temperature of the mixture to a temperature and for a time sufficient for further product species to form and for nuclei to form and grow by condensation to form the product powders, and such that after substantially all of the product powders have condensed from the reactant mixture in the nozzle the coating metals condense on the surface of the product powders,
   (d) exhausting the reactant mixture and product powders from the nozzle into an expansion chamber in a manner to reduce the total enthalpy of the mixture and powders to quickly lower the temperature of the powders sufficiently that the rate of undesired reactions is insignificant, and (e) recovering product powders with a metal coating.

2. A method according to claim 1 wherein the coating metal is selected from the group consisting of copper, gold, silver, tin, zinc, aluminum, cadmium, indium and mixtures thereof.

3. A method according to claim 1 wherein the coating metal is selected from metals in the lanthanide and actinide series having suitably high vapor pressures and mixtures thereof.

4. A method according to claim 1 wherein insufficient carbon, nitrogen or boron are provided in the reactant mixture to react with all of the metal formed by reduction thus providing a source of coating metal comprising the at least one metal that is also present in the product powders in reacted form.

5. The method according to claim 1 wherein ammonia is added to the mixture as a source of nitrogen and hydrogen.

6. The method according to claim 1 wherein a hydride of boride is added to the mixture as a source of boron and hydrogen.

7. A method according to claim 1 wherein the metal compounds for forming the reactant mixture are metal oxide compounds.

8. A method of making metal carbide, nitride or boride powders and mixtures thereof by direct reduction of metal oxide compounds comprising the steps for
  (a) forming a reactant mixture comprising one or more metal oxide compounds, a source of carbon comprising a gaseous hydrocarbon sufficient to reduce the metal compound to form metal, and a source of carbon, nitrogen or boron or mixtures thereof sufficient to react with substantially all of the metal formed by reduction, a small amount of gas or source of a gas selection from hydrogen or helium and mixtures thereof, and a heat exchange gas being substantially inert with respect to the product powders which gas may be selected from helium, argon, nitrogen and hydrogen,
  (b) heating the reactant mixture to temperatures that cause the solid reactants to vaporize and above which the metal compounds are reduced,
  (c) passing the heated reactant mixture through a converging-diverging nozzle designed to reduce the temperature of the mixture to a temperature and for a time sufficient for products to form and for nuclei to form and grow by condensation to form the product powders,
  (d) exhausting the reactant mixture and product powders from the nozzle into an expansion chamber in a manner to reduce the total enthalpy of the mixture and product powders to quickly lower the temperature of the product powders sufficiently that the rate of undesired reactions is insignificant, and
  (e) recovering product powders.

9. A method of making metal carbide product powders by direct reduction of metal oxides comprising the steps for
  (a) forming a reactant mixture comprising one or more metal oxides, a source of carbon sufficient to reduce the metal oxide to form metal, a source of carbon comprising a gaseous hydrocarbon sufficient to react with substantially all of the metal formed by reduction, a small amount of gas or source of a gas selected from hydrogen or helium and mixtures thereof, and a heat exchange gas being substantially inert with respect to the product powders which gas may be selected from helium, argon, nitrogen and hydrogen,
  (b) heating the reactant mixture to temperatures that cause the solid reactants to vaporize and above which the metal oxides are reduced and above which the formation of carbides are favored,
  (c) passing the heated reactant mixture through a converging-diverging nozzle designated to reduce the temperature of the mixture to a temperature and for a time sufficient for additional carbides to form and for nuclei to form and grow by condensation to form the product metal carbide powders,
  (d) exhausting the mixture and metal carbide product powders from the nozzle into an expension chamber maintained at a pressure below the exhaust pressure of the nozzle and mixing with co-flowing steams of heat exchange gas in a manner to reduce the total enthalpy of the mixture and metal carbide powders to quickly lower the temperature of the metal carbide powders sufficiently that the rate of oxide formation is insignificant, and
  (e) electrostatically recovering metal carbide powders.

10. A method according to claim 9 for making carbides of the group IVb transition metal selected from the group consisting of titanium, zirconium and hafnium wherein the oxide comprises a reactant mixture selected from the group IVb transition metals in powdered form.

11. A method according to claim 9 for making carbides of the group Vb transition metal selected from the group consisting of vanadium, niobium, and tantalum wherein the oxide comprises a reactant mixture selected from the group Vb transition metals in powdered form.

12. A method according to claim 9 for making carbides of the group VIb transition metal selected from the group consisting of chronium, molybdenum, and tungsten wherein the oxide comprises a reactant mixture selected from the group VIb transition metals in powdered form.

13. A method according to claim 9 for making aluminum carbide wherein the reactant mixture comprises an oxide of aluminum in powdered form.

14. A method according to claim 9 for making silicon carbide wherein the reactant mixture comprises an oxide of silicon in powdered form.

15. The method according to claim 9 wherein the carbon source is methane.

16. The method according to claim 9 wherein the mole ratio of inert gas in the reactant mixture to metal oxide in the mixture is between 0.1:1 and 10:1.

17. The method according to claim 9 wherein the mole ratio of inert gas in the reactant mixture of metal oxide in the mixture is at least 1:1.

18. A method according to claims 1, 8, or 9 wherein the mixture is heated in excess of 2,000 degrees Kelvin prior to passing through the nozzle.

19. A method according to claims 1, 8, or 9 wherein the mixture is heated in the range 3000 to 4500 degrees Kelvin prior to passing through the nozzle.

20. The methods according to claims 1, 8, or 9 wherein the recovered powders have a particle size between 0.01 and 1 micron.

21. The methods according to claims 1, 8, or 9 wherein the gas selected from hydrogen and helium is present in sufficient amount such that as the mixture is passed through the nozzle energy stored in vibrational modes is sufficiently rapidly transferred to other energy storage modes such that condensation proceeds and undesirable reactions do not take place.

22. The methods according to claims 1, 8, or 9 wherein the gas selected from hydrogen and helium in the reactant mixture is between 5 and 75 mole percent.

23. The methods according to claims 1, 8, or 9 wherein the temperature of the reactant mixture and product powders in the expansion chamber are reduced to below 1300 degrees Kelvin.

24. The method according to claims 1, 8, or 9 wherein the amount of heat exchange gas in the mixture is sufficient to absorb sufficient heat of condensation during the expansion through the nozzle to enable the condensation to continue.

25. The method according to claims 1, 8, or 9 wherein the pressure on the inlet side of the nozzle is between 1 and 100 atmospheres.

26. The method accordng to claims 1, or or 9 wherein the nozzle has an orifice between 0.1 and 5.0 cm in radius and a length between 0.2 and 2 meters and the outlet cone has an L value between 5 and 35.

27. The method according to claims 1, 8, or 9 wherein the nozzle orifice area to outlet area ration (A/A*) is at least 2.

28. The method according to claims 1, 8, or 9 wherein the nozzle orifice area to inlet area ratio (A/A*) is between 5 and 100 such that inlet flow from the reactor is initially at a low speed.

29. The method according to claim 3 wherein the particle size of the metal oxide introduced into the mixture is minus 65 mesh.

30. The method according to claims 1, 8, or 9 wherein the mixture is heated in a dispersed discharge reactor in, which a strong turbulence is maintain.

31. The methods according to claim 30 wherein the method is a continuous process.

32. The methods according to claim 31 wherein the residence time in the reactor is about 1 second.

* * * * *